(12) United States Patent
Pacha et al.

(10) Patent No.: US 10,615,737 B1
(45) Date of Patent: Apr. 7, 2020

(54) SYSTEM AND METHOD OF ESTIMATING TEMPERATURE OF A POWER SWITCH OF A POWER CONVERTER WITHOUT A DEDICATED SENSOR

(71) Applicant: NXP USA, Inc., Austin, TX (US)

(72) Inventors: Matej Pacha, Jihlava (CZ); Branislav Zigmund, Vrbovce (SK); Carlos Vazquez Goyarzu, Munich (DE); Hubert Martin Bode, Haar (DE); Patrik Varecha, Turzovka (SK); Břetislav Zuczek, Senov (CZ)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/139,294

(22) Filed: Sep. 24, 2018

(51) Int. Cl.
| | |
|---|---|
| G05B 5/00 | (2006.01) |
| H02P 29/68 | (2016.01) |
| G01K 7/01 | (2006.01) |
| H02M 3/335 | (2006.01) |
| H01L 27/02 | (2006.01) |

(52) U.S. Cl.
CPC ............... *H02P 29/68* (2016.02); *G01K 7/01* (2013.01); *H01L 27/0266* (2013.01); *H02M 3/33507* (2013.01); *G01K 2205/00* (2013.01)

(58) Field of Classification Search
CPC . H02M 1/36; H02M 3/155; H02M 2001/0003
See application file for complete search history.

(56) References Cited

U.S. PATENT DOCUMENTS

| | | | |
|---|---|---|---|
| 5,025,298 | A | 6/1991 | Fay et al. |
| 6,930,371 | B2 | 8/2005 | Necco et al. |
| 8,742,825 | B2 | 6/2014 | Heppenstall et al. |
| 9,608,558 | B1 | 3/2017 | Heiling et al. |
| 2005/0088863 | A1 | 4/2005 | Pearce |
| 2007/0004054 | A1 | 1/2007 | Orr |
| 2011/0140630 | A1* | 6/2011 | Doudousakis ........ H02M 3/156 315/291 |
| 2015/0168462 | A1 | 6/2015 | Singh |
| 2017/0077862 | A1 | 3/2017 | Heiling et al. |

OTHER PUBLICATIONS

Musallam, Mahera et al. "Real-Time Power Electronic Device Junction Temperature Estimation." The Institution of Electrical Engineers. IEEE. 2004 pp. 231-235.
(Continued)

*Primary Examiner* — Karen Masih

(57) ABSTRACT

A system for a power switch of a multiphase power converter coupled to an inductive load including a test controller, a voltage sampling circuit, a processing circuit, and a converter. A test pulse is applied to power switches of the converter to generate a test current through the inductive load, which forward biases a body diode of a power switch during a freewheel portion after the test pulse is completed. The voltage across the body diode is sampled during the freewheel portion, and the voltage samples are converted to a voltage value and a slope value. The voltage and slope values are converted to an estimated temperature value based on a characterization of the inductive load and the body diode. The conversion may be performed by a lookup table that stores an estimated temperature value for each unique combination of the voltage and slope values.

20 Claims, 8 Drawing Sheets

(56) References Cited

OTHER PUBLICATIONS

Zhang, Yuan et al. "Junction Temperature Estimation and Protection Scheme for SiC MOSFET Devices." IEEE ICBEST Aug. 31-Sep. 1, 2015. Singapore. pp. 85-89.
Embedded Microprocessor Benchmark Consortium (EMBC). *About EMBC*. Retrieved from https://www.eembc.org/ulpmark/about.php on Jul. 24, 2018. pp. 1-2.

* cited by examiner

US 10,615,737 B1

SYSTEM AND METHOD OF ESTIMATING TEMPERATURE OF A POWER SWITCH OF A POWER CONVERTER WITHOUT A DEDICATED SENSOR

BACKGROUND OF THE INVENTION

Field of the Invention

The present invention relates in general to power converters, and more specifically to a system and method of estimating the temperature of a power switch of a power converter without using a dedicated sensor.

Description of the Related Art

The temperature of a power switch of an electrical or electronic power converter is important diagnostic information. The power switch may be a MOSFET or any type of transistor with an integrated body diode, such as an insulated-gate bipolar transistor (IGBT) or the like. The temperature of the power switch can be measured using a dedicated temperature sensor, such as a temperature sensor placed in close proximity to the power switch. Alternatively, the temperature may otherwise be estimated based on the temperature of a gate driver or a microcontroller. A dedicated temperature sensor, however, adds cost, consumes valuable printed circuit board space, and increases the risk of failure. In addition, temperature measured by an external temperature sensor or estimated based on temperature of another device introduces significant error due to differences between the switch die temperature and the sensor temperature. The temperature can be also estimated or calculated using the body diode voltage drop during normal operation. If the current is known, the diode voltage drop can be measured and the power switch die temperature can be estimated or calculated based on the known characteristics of the body diode. A current sensor is usually necessary, however, for accurate current measurement.

Recent developments are targeting power converters without a current sensor. Thus, there is no temperature sensor and there is no current sensor. Instead, the current is determined based on the voltage drop over the power switch while turned on during normal operation. Such methods require, however, that the temperature of the power switch be known. The temperature can be estimated once the power converter is running and if the initial temperature of the MOSFET is known. Once the current is known, the temperature changes across the resistance of the power switch (e.g., MOSFET drain-to-source resistance or $R_{DSON}$) can be estimated using the body diode temperature estimation. An example of such a method was introduced in U.S. Pat. Appl. Ser. No. 2015/0168462, filed Dec. 13, 2013, entitled "Sensorless Current Sensing Methods For Power Electronic Converters" by Brij N. Singh (hereinafter Singh). A significant problem with the Singh method is that the disclosed algorithm cannot determine initial temperature or current level. Instead, the algorithm must be operated for a significant amount of time for each start before temperature or current can be accurately determined. Furthermore, the eventual determination of an overtemperature condition may occur too late after the system has been operating at an excessive temperature level.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

A standard diode can be used as a very good temperature sensor. The body diode of a power switch, such as a MOSFET or IGBT or the like, is an integral part of the transistor and it is the closest sensor to the switch power channel. As described herein, the voltage across the body diode of a power switch of a power converter is sampled and used for an initial estimation of the die temperature of the power switch. In a particular embodiment described herein, an array of power switches are organized into multiple phases to drive a multiphase inductive load, such as an electric motor or the like. A test pulse is applied to one of the power switches to drive a test current through the inductive load while the inductive load is not operating, in which the test current forward biases the body diode of another power switch during a freewheel portion immediately after the test pulse is terminated. The test pulse is sufficiently narrow to avoid driving the load into operation. The voltage across the body diode is sampled multiple times, and the test is repeated over multiple test cycles to determine a voltage value and a slope value. The voltage and slope values are then provided to a converter which converts the values to an estimated temperature value. The converter converts the voltage and slope information based on a characterization of the inductive load and a characterization of the inherent diode of the power switch. In one embodiment, the converter may be implemented as a table which incorporates load and body diode characteristic information, in which the table provides an initial temperature estimation value that corresponds with the voltage and slope values. The initial temperature estimation can then be used for any other shunt-less current measurement technique used during operation of the inductive load.

Figure 1:
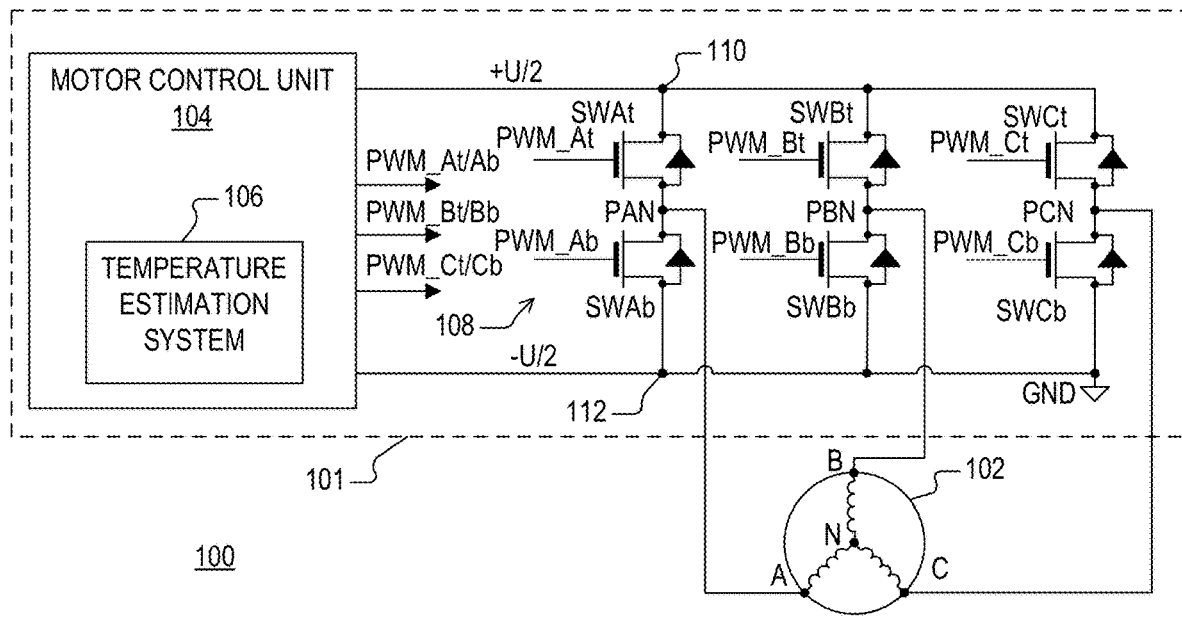
FIG. 1 is a simplified schematic and block diagram of a power converter for controlling an electric motor, in which the power converter includes a temperature estimation system implemented according to one embodiment.

FIG. 1 is a simplified schematic and block diagram of a power system 100 including a power converter 101 and an electric motor 102, in which the power converter 101 controls operation of the electric motor 102 and includes a temperature estimation system 106 implemented according to one embodiment. The illustrated electric motor 102 is a three-phase (3-ph) motor, such as a 3-ph BLDC (brushless DC) motor, a 3-ph PM (permanent magnet) synchronous motor, a 3-ph AC induction motor, etc., although it is understood that applicable embodiments may include electric motors with any number of phases including those with 2 or more phases. Applicable embodiments with electric motors may include automotive applications or the like, such as motors used in fuel pumps, oil pumps, water pumps, air-conditioning fans, motor cooling fans, oil pumps, etc. Also, applicable embodiments include power converters that drive any type of inductive load or that include inductive elements at the output, such as AC-DC and DC-DC converters and the like. Any applicable inductive load has a designed operating range in which it is considered operating or in operation when driven within its designed operating range. An electric motor, for example, is considered operating when moving or spinning, and is considered not operating when stopped or otherwise not moving.

The power converter 101 includes a motor control unit 104 and an array of power switches 108 forming three switching phases Phase A, Phase B and Phase C for driving the electric motor 102. Each of the switching phases is coupled between a pair of DC bus voltages generated by the motor control unit 104 including a positive bus 110 developing a voltage +U/2 and a negative bus 112 developing a voltage −U/2. Each switch phase includes an upper or "top" power switch "t" and a lower or "bottom" switch "b" in which each pair of power switches has current terminals coupled in series between the buses 110 and 112. As shown, for example, Phase A includes power switches SWAt and SWAb, Phase B includes power switches SWBt and SWBb, and Phase C includes power switches SWCt and SWCb. Each of the power switches 108 includes a control terminal and a pair of current terminals. The top power switches SWAt, SWBt and SWCt each have a first current terminal coupled to the positive bus 110, and the bottom power switches SWAb, SWBb and SWCb each have a second current terminal coupled to the negative bus 112. The second current terminal of SWAt is coupled to the first terminal of SWAb at an intermediate node PAN for Phase A, the second current terminal of SWBt is coupled to the first terminal of SWBb at an intermediate node PBN for Phase B, and the second current terminal of SWCt is coupled to the first terminal of SWCb at an intermediate node PCN for Phase C. The 3-ph electric motor 102 has a star configuration including three phase terminals A, B, and C and a common or neutral terminal N, in which PAN is coupled to phase terminal A, PBN is coupled to phase terminal B, and PCN is coupled to phase terminal C. The motor control unit 104 drives a voltage U between the positive and negative buses 110 and 112 to a suitable voltage level for driving sufficient current to drive the electric motor 102, in which the negative bus 112 is coupled to a suitable power supply reference voltage such as ground (GND).

The motor control unit 104 develops control signals for controlling each of the power switches 108 for driving and controlling the electric motor 102. In the illustrated embodiment, each control signal is a pulse-width modulation (PWM) signal having a selected frequency and a controlled duty cycle. The PWM control signals include PWM_At provided to the control terminal of SWAt, PWM_Ab provided to the control terminal of SWAb, PWM_Bt provided to the control terminal of SWBt, PWM_Bb provided to the control terminal of SWBb, PWM_Ct provided to the control terminal of SWCt, and PWM_Cb provided to the control terminal of SWCb. The motor control unit 104 includes the temperature estimation system 106 as further described herein.

Figure 8:
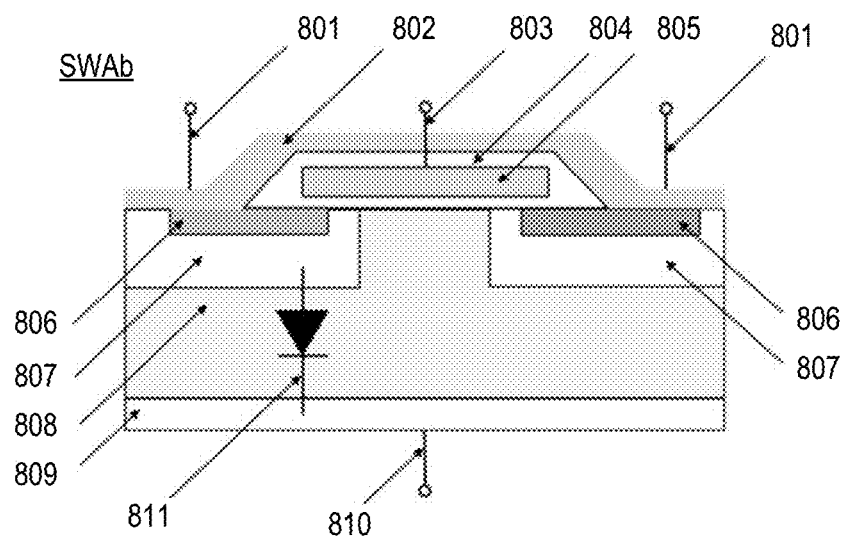
FIG. 8 is a more detailed diagram of the MOSFET structure of the power switch SWAb of FIG. 1 when MOSFETs are used to implement the power switches.

The power switches 108 are depicted as N-type MOSFETs in the illustrated configuration, in which each upper current terminal is a drain terminal, each lower current terminal is a source terminal, and each control terminal is a gate terminal. Each MOSFET includes a built-in parasitic body diode integrated within the MOSFET structure, in which each body diode has its anode coupled to the source terminal and its cathode coupled to the drain terminal. FIG. 8 is a more detailed diagram of the MOSFET structure of the power switch SWAb when MOSFETs are used to implement the power switches 108. The MOSFET structure of SWAb includes source connection(s) 801, a source metallization 802, a gate terminal 803, a gate 805 coupled to the gate terminal 803, an interlayer dielectricum 804 (which isolates the gate 805 from the source metallization 802), a source diffusion 806 (N-type for NMOS), a body diffusion 807 (P-type for NMOS), a lightly doped drain 808 (N-type for NMOS), a drain diffusion 809 (N-type for NMOS), and a drain terminal 810 coupled to the drain diffusion 809. A body diode 811 is formed between the body diffusion 807 and the drain 808/drain diffusion 809 and thus effectively coupled between the source and drain terminals as depicted in FIG. 1 for each of the power switches 108.

Although the power switches 108 in the embodiment depicted in FIG. 1 are implemented using N-type MOSFETs each with an integrated body diode, alternative transistor types with integrated body diodes are contemplated, such as a P-type MOSFET or an IGBT or the like. Any suitable power transistor with an integrated die-connected body diode may be used for estimating temperature.

Figure 2:
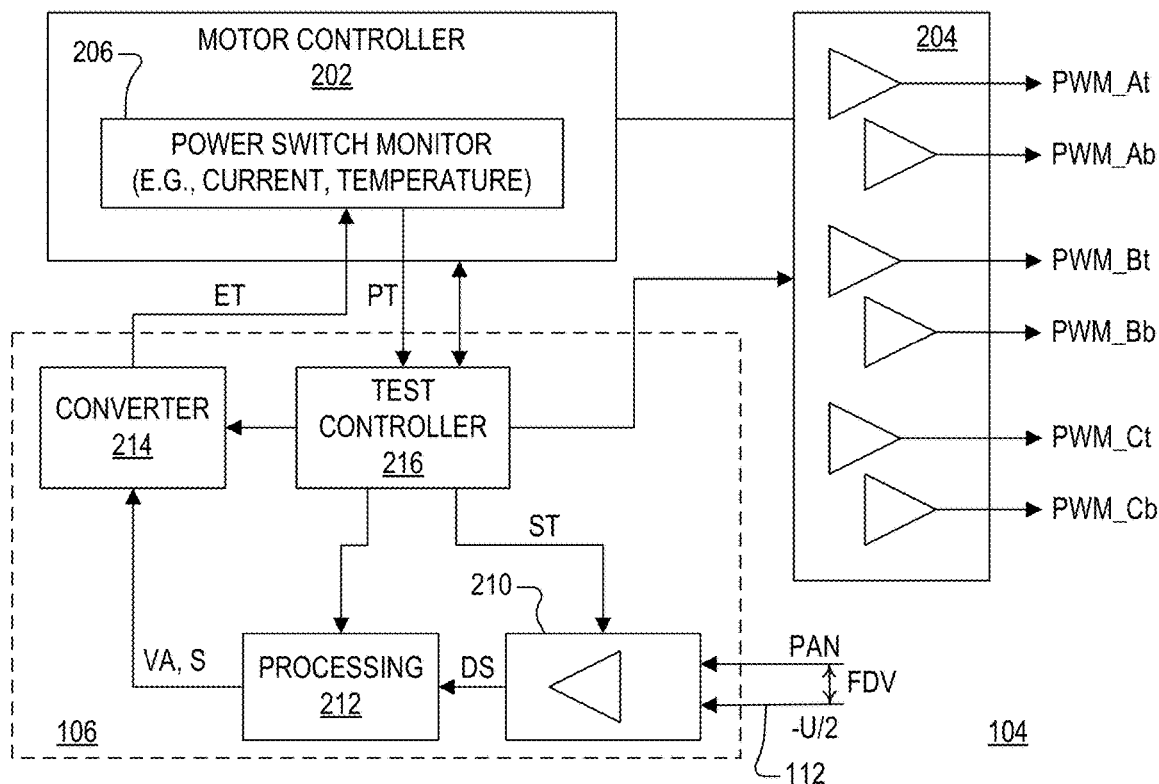
FIG. 2 is a more detailed yet still simplified block diagram of the motor control unit of FIG. 1 according to one embodiment.

FIG. 2 is a more detailed yet still simplified block diagram of the motor control unit 104 according to one embodiment. The illustrated motor control unit 104 includes a motor controller 202, a power switch driver 204, and the temperature estimation system 106. The motor controller 202 controls the power switch driver 204 to develop the PWM control signals PWM_At/Ab, PWM_Bt/Bb, and PWM_Ct/Cb during normal operation. A separate gate amplifier or driver may be provided to drive each of the PWM signals. The operation of the motor controller 202 for controlling the electric motor 102 during normal operation is not specifically described herein. In general, the motor controller 202 controls the power switch driver 204 to generate the PWM control signals to control motor functions, such as starting, stopping, and speed control. The motor controller 202 includes a power switch monitor 206 that is used to monitor operating parameters of one of more of the power switches 108, such as switch current and switch temperature. The power converter 101 does not include a current sensor and does not include a temperature sensor for the power switches 108. Instead, the temperature estimation system 106 provides an estimated temperature value ET which is an estimate of the initial temperature of the power switches 108 while the electric motor 102 is not operating, meaning stopped or not moving. The power switch monitor 206 uses the estimated temperature value ET to quickly and accurately determine current and temperature of the power switches 108 in an expedient manner during normal operation when the electric motor 102 is moving or spinning.

The temperature estimation system 106 includes a voltage sampling circuit 210, a processing circuit 212, a converter 214 and a test controller 216. The test controller 216 is shown coupled to the power switch monitor 206 and the motor controller 202 and it may further be coupled to the power switch driver 204. In one embodiment, the power switch monitor 206 prompts the test controller 216, such as via a prompt signal PT or the like, to determine and provide an estimated temperature value ET indicating the initial temperature of the power switches 108. In this case, the power switch monitor 206 determines when the electric motor 102 is stopped, such as before being started or after being stopped, and then prompts the test controller 216 to provide ET. In another embodiment, the test controller 216 may independently monitor operations of the motor controller 202 for determining when the electric motor 102 is stopped and when an estimated temperature value ET should be provided or at least made available. During a test procedure, the test controller 216 controls the power switch driver 204, either directly or via the motor controller 202, to generate a test pulse to the power switches 108 for each of one or more test cycles. The test controller 216 also controls the voltage sampling circuit 210 to sample a voltage FDV across one of the power switches 108 multiple times, and also controls the processing circuit 212 and the converter 214 to convert the sampled voltages to the estimated temperature value ET provided to the switch monitor 202.

The voltage sampling circuit 210 has a first input coupled to the PAN node, has a second input coupled to node 112 (voltage −U/2, or GND), and has an output providing a digital sample (DS) to an input of the processing circuit 212. The voltage between PAN and −U/2 is the voltage across the current terminals of the power switch SWAb shown as a difference voltage FDV, which is also the voltage across its internal body diode 811 as shown in FIG. 8 when the power switch SWAb is configured as a MOSFET. The test controller 216 prompts the voltage sampling circuit 210 to take multiple voltage samples of FDV during the test procedure immediately after each test pulse, in which the voltage sampling circuit 210 responsively provides multiple digital samples on DS. This process may be repeated for each of multiple test cycles. The processing circuit 212 converts multiple digital samples on DS to a voltage value VA and a slope value S as further described herein, in which VA and S are provided to respective inputs of the converter 214. The converter 214 converts the VA and S values to an estimated temperature value ET based on characteristic information of the body diode 811 of the power switch SWAb and a characterization of the load parameters of the electric motor 102. In one embodiment, the characterization data may be described using a formula or the like, such as using a reference model, interpolation or approximation. The power switch monitor 206 uses the ET value from the temperature estimation system 106 to quickly resolve temperature and current information during operation of the electric motor 102.

Figure 3:
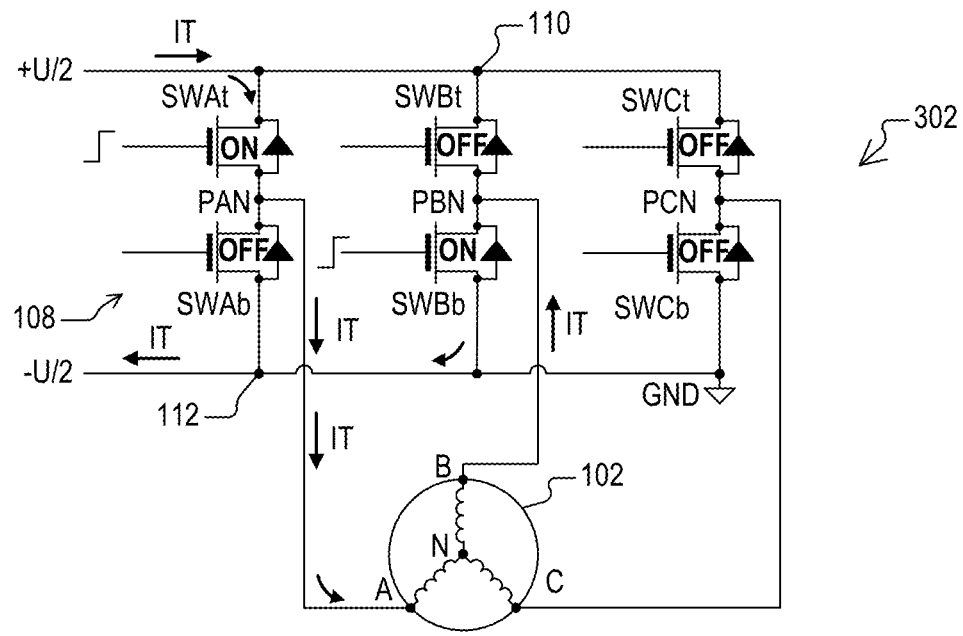
FIG. 3 illustrates operation of the test pulse on the power switches of FIG. 1 in which the power switches are shown in two sequential states during a test cycle according to one embodiment.
Figure 3:
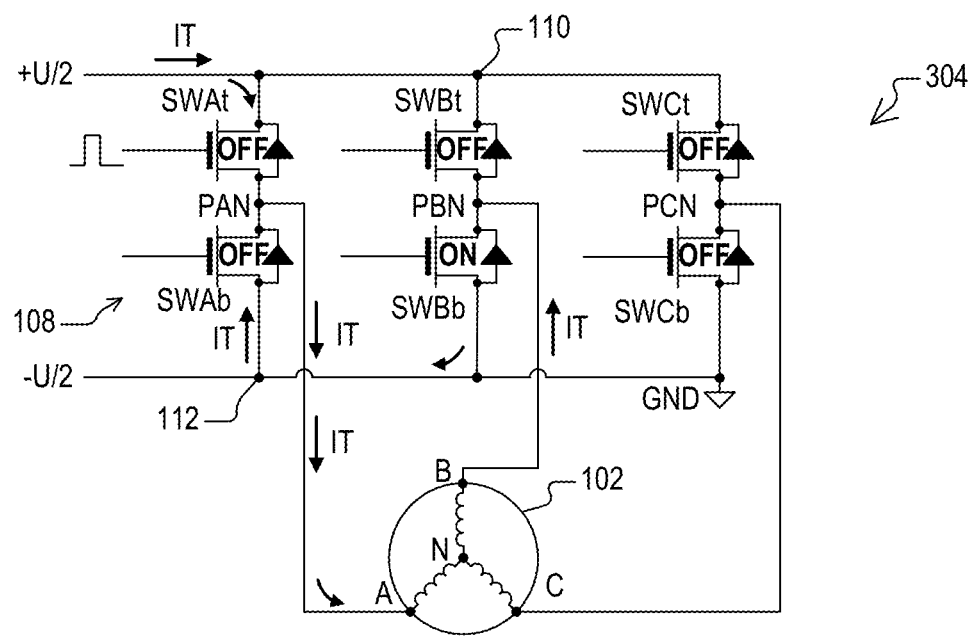

FIG. 3 shows two schematic depictions of the power switches 108 and the electric motor 102 in which the power switches are shown in two sequential states 302 and 304 in response to a test pulse on the power switches 108 during a test cycle according to one embodiment operation. Preliminarily, all of the power switches 108 may be turned off and the electric motor 102 is stopped. When the electric motor 102 is stopped and an estimated temperature measurement is prompted, the test controller 216 prompts the power switch driver 204 to assert both PWM_At and PWM_Bb high to turn on the power switches SWAt and SWBb while the remaining power switches 108 are turned off as shown by state 302. A set of arrows depict the resulting test current IT flowing through the activated power switches 108 and the electric motor 102. Since SWAt is on, the voltage +U/2 is applied via node PAN to terminal A of the electric motor 102 causing a test current IT to flow through SWAt to the electric motor 102 via node PAN. Also, since SWBb is also turned on, the test current IT flows through the inductive coils and from terminal B of the electric motor 102 to node PBN and then through SWBb to the bus 112 of the power switches 108.

After a short duration and before the electric motor 102 is driven into operation causing it to move or begin spinning, the test controller 216 prompts the power switch driver 204 to turn off SWAt causing transition to state 304. Although the power switch SWAt is turned off so that +U/2 is no longer applied to the electric motor 102, the test current IT flowing through the inductive coils of the electric motor 102 continues to flow as depicted by another set of arrows. During this freewheel portion of the cycle, the test current IT forward biases the body diode 811 of the power switch SWAb even though SWAb remains turned off. Essentially, the test current IT flowing to the bus 112 from the power switch SWBb is redirected to forward bias the body diode 811 of the power switch SWAb, flowing back to terminal A of the electric motor 102, and out of terminal B through the power switch SWBb and back to the bus 112. In summary of a test cycle, while the electric motor 102 is stopped, the power switch SWBb is turned on and the test pulse is applied to PWM_At to turn on and then back off the power switch SWAt to generate the test current IT to forward bias the body diode 811 of the power switch SWAb.

It is noted that the test pulse applied on PWM_At to generate the test current IT has a sufficiently short duration so that the electric motor 102 is not driven into operation causing it to begin moving or spinning. The electric motor 102 is designed to operate with PWM control signals operating within a particular frequency range and within a specified duty cycle range. In one embodiment, for example, the duty cycle range is from 10% to 90% in which a 10% duty cycle generally defines a minimum pulse width associated with driving the electric motor 102 into operation. The test pulse applied on PWM_At has a duration that is less than the minimum pulse, e.g., less than 10%, such as at or near 5% or any other suitable duration to generate the test current IT without driving the electric motor 102 into operation so that the electric motor 102 remains stopped. In this manner, the electric motor 102 remains turned off while the test pulse generates the test current IT to forward bias the body diode 811 of the power switch SWAb. During the freewheel portion depicted by state 304 immediately after the test pulse is terminated, the voltage sampling circuit 210 detects and samples the corresponding forward bias voltage FDV across the body diode 811 of SWAb.

Figure 4:
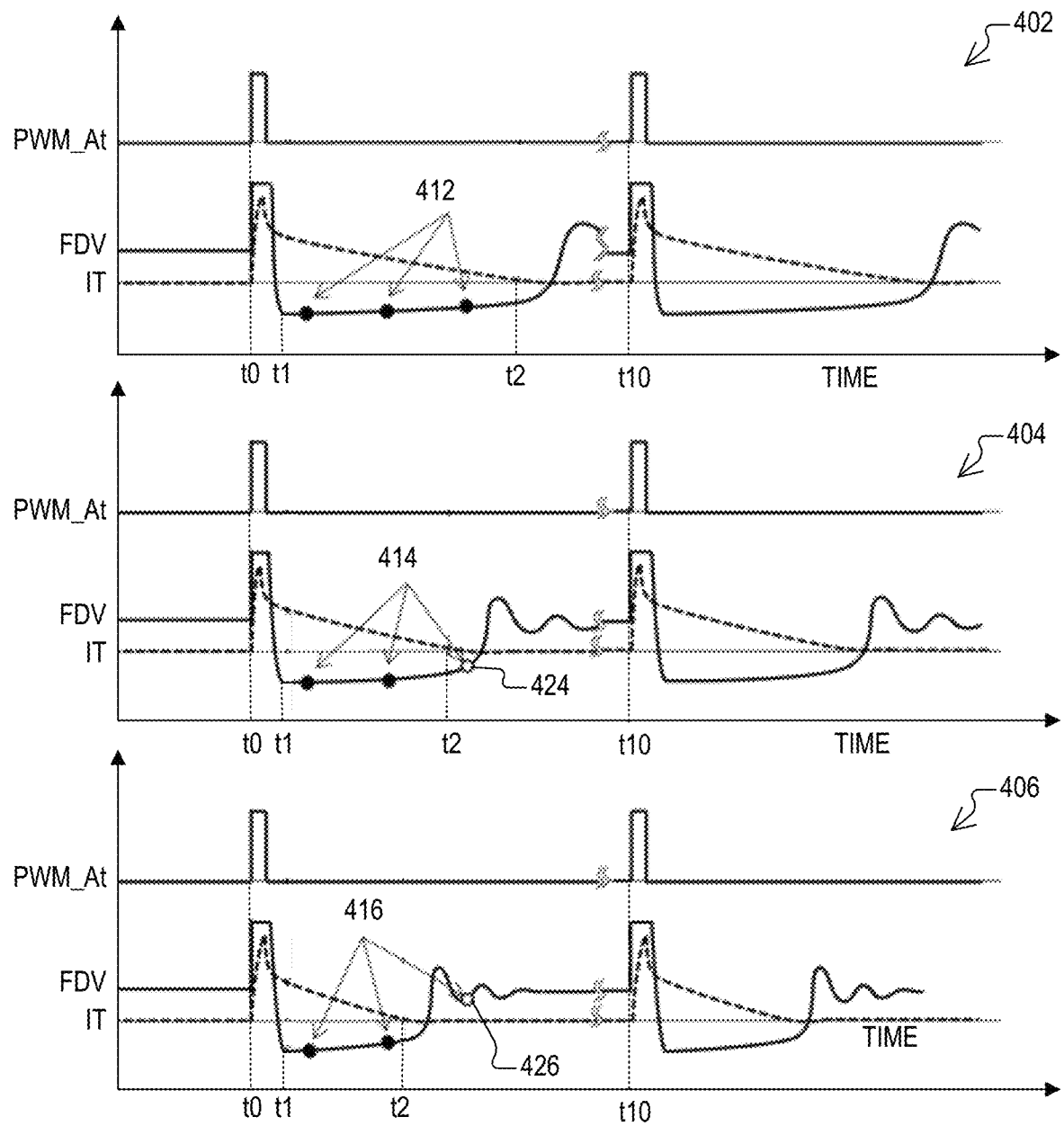
FIG. 4 is a series of three timing diagrams illustrating a discontinuous current test mode for the same load (e.g., the same electric motor) under three different situations with different load conditions according to one embodiment.

FIG. 4 is a series of three timing diagrams 402, 404, and 406 illustrating a discontinuous current test mode for the same load (e.g., the same electric motor 102) under three different situations with different load conditions according to one embodiment. The load conditions include at least the load temperature, and an arbitrary stopped rotor position causing a different load resistance in response to different temperature, a change of inductance over rotor position, etc. Each timing diagram plots the signal PWM_At, the voltage FDV, and the current IT versus time for at least one test cycle. For each timing diagram 402, 404, and 406, PWM_At is pulsed high beginning at a time t0 and then back low with a specified duration that is less than the minimum pulse width associated with activation and operation of the electric motor 102 as previously described. FDV goes high at time t0, then goes low after PWM_At is pulled back low, reaches a minimum voltage level at about a subsequent time t1, and then increases in a linear manner after time t1. IT also shoots to a high value beginning at time t0, then is reduced after PWM_At is pulled back low, and then decreases in a relatively linear manner beginning at about time t1. Thus, after time t0, IT decreases while FDV increases in a relatively linear manner until IT reaches a minimum level at a subsequent time t2.

FDV is sampled a number of times by the voltage sampling circuit 210 for each test cycle as controlled by the test controller 216 as shown at 412 for timing diagram 402, as shown at 414 for timing diagram 404, and as shown at 416 for timing diagram 406. In each case for the illustrated embodiment, three different samples are taken during the particular test cycle. It is noted, however, that the number of samples taken may be as little as two or as many as can be taken (e.g., 2 or more) in the given amount of time. The process is repeated for as many test cycles as there is sufficient time or until a sufficient number of test cycles are performed to achieve a desired level of accuracy. The electric motor 102 remains stopped during the entire test process regardless of the number of test cycles performed. Each sample of each test cycle is averaged together with the corresponding samples of the other test cycles for a given load condition. This does not mean that the corresponding samples of 412, 414 or 416 are averaged or combined; instead the test cycle shown for timing diagram 402 is repeated for that first load condition, or the test cycle shown for timing diagram 404 is repeated for that second load condition, or the test cycle shown for timing diagram 406 is repeated for that third load condition, and the samples for multiple test cycles of a given test condition are filtered or averaged.

In each case for a given load condition, all first samples may be averaged to obtain a first sample average, all second samples are averaged to obtain a second sample average, and so on. The total number of cycles per test operation depends on the available time and the desired accuracy. Although a single cycle may be sufficient to achieve a valid result, 100 cycles provides a higher level of accuracy, 1,000 cycles achieves an even greater level of accuracy, 10,000 cycles achieves a very high level of accuracy, and so on. The number of cycles may also be any intermediate number, such as 200, 500, 1,500, 15,000, etc., for as long as conditions allow and before the given load condition changes by a significant amount.

A comparison of the timing diagrams 402, 404, and 406 reveals that the duration from time t1 to time t2 varies depending upon the load conditions including temperature. The reason for this is that the rate of change or gradient or slope of both IT and FDV depends upon the particular load condition when the test procedure is performed. Although not readily discernable from the timing diagrams 402, 404, and 406, the initial voltage at about time t1 also varies from one timing diagram to another also based on the particular load condition when the test procedure is performed. When the test pulse is repeated for multiple cycles as previously described, however, the load conditions are assumed to be the same or substantially the same. The sample averages provide a more accurate measurement of the voltage level and the corresponding slope for the particular load condition. As described further herein, this information may be used to determine the estimated temperature value ET.

The discontinuous current test mode is characterized by IT reaching its minimum level (or zero) at time t2 (and FDV stabilizing to its original level) before the next test cycle is initiated at a subsequent time t10. At least two valid samples per test cycle are needed to obtain slope information as further described herein. In the first case shown at 412, all three samples are valid since all three occur before time t2 when IT reaches its minimum level. In the second case shown at 414, only the first two samples are valid since both occur before time t2, but the last sample 424 is not valid since it occurs after time t2. In the third case shown at 416, only the first two samples are valid since both occur before time t2, but the last sample 426 is not valid since it occurs after time t2. The determination of valid samples is clearly evident by inspection of the three different timing diagrams since it is evident which samples occur before or after time t2.

The power converter 101, however, does not have a current sensor so that the processing circuit 212 cannot directly sense when IT goes to zero. Instead, the processing circuit 212 evaluates the digital samples DS (or averaged DS samples) to distinguish which are valid and which are not. The validity process may be determined for each cycle on a cycle by cycle basis or may occur after multiple cycles in which the samples are averaged. In any configuration, the system is designed to ensure that at least the first two samples are valid since at least two valid samples are needed to derive slope information. In one embodiment, the processing circuit 212 determines a slope value between the first two samples (or sample averages) and compares with the slope between each subsequent and sequential pair of samples to evaluate validity. For example, the first voltage sample V1 at a time T1 and the second voltage sample V2 at a time T2 have an associated slope value of $(V2-V1)/(T2-T1)=S1$ which is assumed to be a valid slope value. The second voltage sample V2 at a time T2 and the third voltage sample V3 at a time T3 have an associated slope value of $(V3-V2)/(T3-T2)=S2$. If S2 deviates from S1 by a predetermined or threshold amount for a given configuration, then the third sample is considered invalid (such as the sample 424 for timing diagram 404 or the sample 426 for timing diagram 406). This validity process may be repeated for as many sequential sample pairs that are provided.

Figure 5:
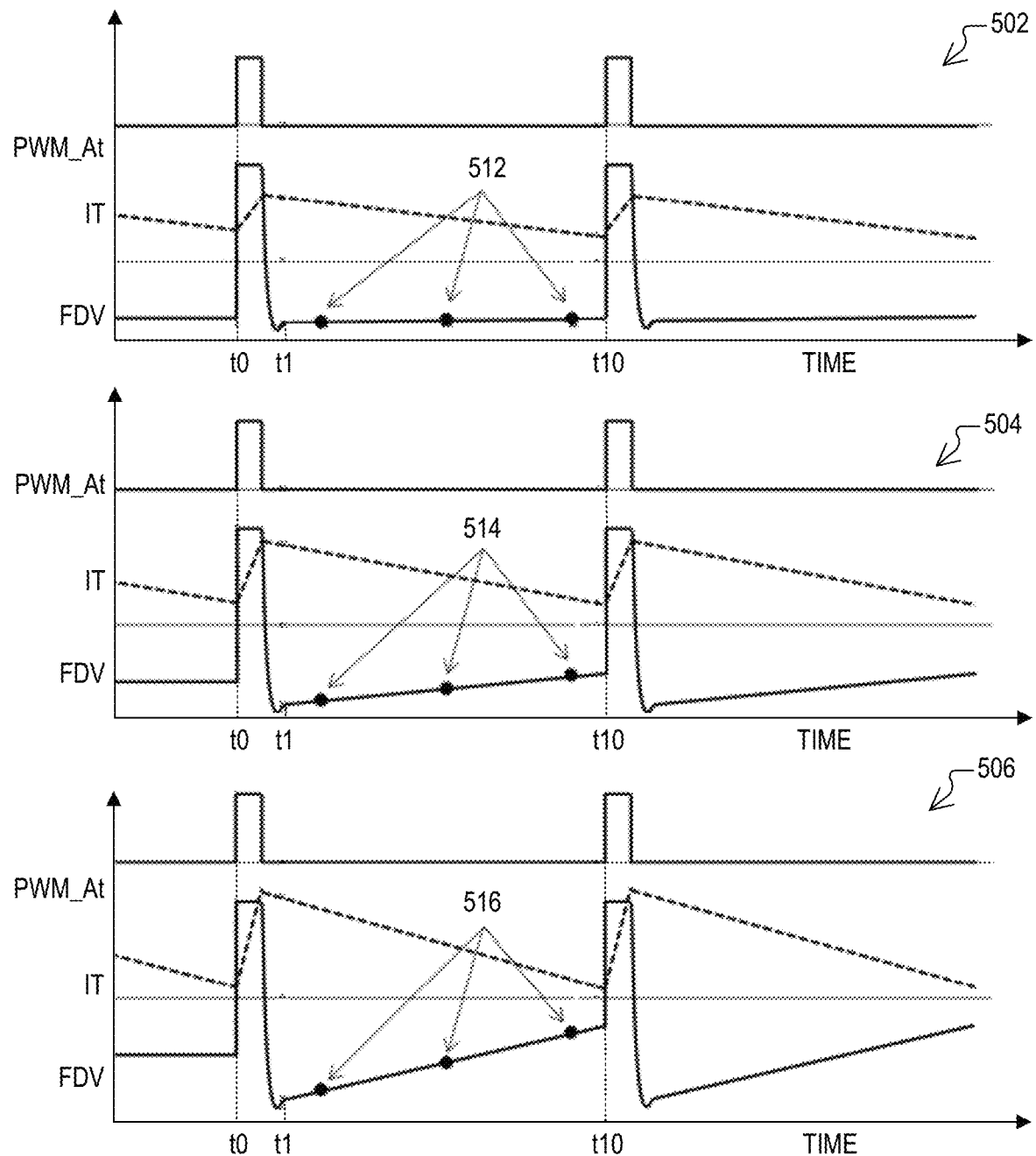
FIG. 5 is a series of three timing diagrams illustrating a continuous current test mode for the same load (e.g., the same electric motor) under three different situations with different load conditions according to another embodiment.

FIG. 5 is a series of three timing diagrams 502, 504, and 506 illustrating a continuous current test mode for the same load (e.g., the same electric motor 102) under three different situations with different load conditions (in a similar manner as shown and described for the three timing diagrams 402, 404, and 406, respectively, of the discontinuous mode) according to another embodiment. Again, each timing diagram plots the signal PWM_At, the voltage FDV, and the current IT versus time. Also, for each timing diagram 502, 504, and 506, PWM_At is pulsed high beginning at a time t0 and then back low with a specified duration that is less than the minimum pulse width associated with activation and operation of the electric motor 102 as previously described. FDV goes high at time t0, then goes low after PWM_At is pulled back low, reaches a minimum voltage level at about a subsequent time t1, and then increases in a linear manner after time t1. IT also shoots to a high value beginning at time t0, then is reduced after PWM_At is pulled back low, and then decreases in a relatively linear manner beginning at about time t1.

In a similar manner as for the discontinuous mode, FDV is sampled a number of times by the voltage sampling circuit 210 for each test cycle as controlled by the test controller 216 as shown at 512 for timing diagram 502, as shown at 514 for timing diagram 504, and as shown at 516 for timing diagram 506. Again, although three different samples are taken during each test cycle, the number of samples taken may be as little as two or as many as can be taken (e.g., 2 or more) in the given amount of time. Also, the process is repeated for as many cycles as there is sufficient time or until a sufficient number of test cycles are performed to achieve a desired accuracy. Each sample of each cycle may be averaged together with the corresponding samples of the remaining samples for a given test procedure for a given load condition in a similar manner as the discontinuous mode, and the total number of cycles per test operation depends on the available time and the desired accuracy (e.g., 100, 1,000, 10,000, etc., or any other suitable intermediate number).

A primary difference between the continuous mode illustrated in FIG. 5 as compared to the discontinuous mode illustrated in FIG. 4 is that IT does not reach a minimum level before the next test cycle beginning at time t10 for each of the subsequent test cycles. In this manner, none of the voltage samples of FDV are considered invalid since each one is taken while FDV is generally varying in a linear manner. In this manner, the validity process may be eliminated so that the continuous mode may be advantageous if the system conditions allow. Also, in a similar manner as for the discontinuous mode, the initial voltage of FDV at about time t1 and the rate of change of FDV from one sample to the next both depend upon the particular load condition when the test procedure is performed. Furthermore, when the test is repeated for multiple cycles as previously described, the load conditions are assumed to be the same or substantially the same, so that the sample averages provide a more accurate measurement of the voltage level and the corresponding slope for the particular load condition, and this information may be used to determine the estimated temperature value ET.

Figure 6:
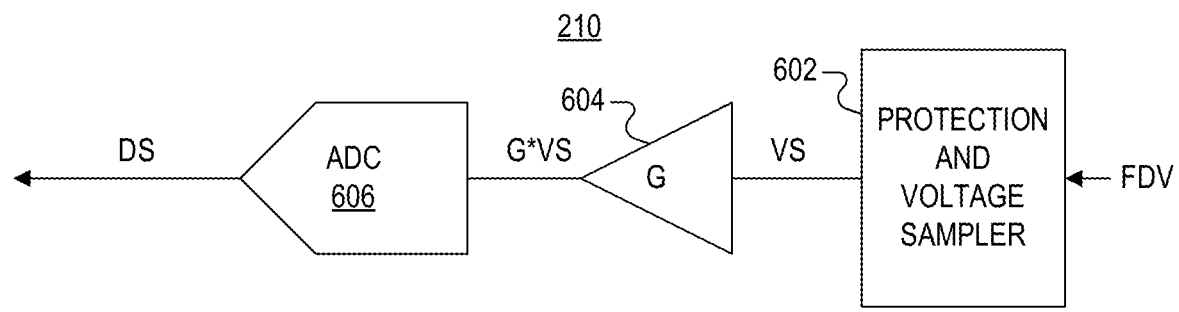
FIG. 6 is a simplified block of the voltage sampling circuit of FIG. 2 according to one embodiment.

FIG. 6 is a simplified block of the voltage sampling circuit 210 according to one embodiment. One problem of sensing voltage across the body diode 811 of the low side power switch SWAb is that the power switch SWAb is exposed to a very diverse voltage range in its two states during the test procedure. When SWAt is switched on providing the voltage U/2 to one of the phases of the electric motor 102, a relatively high voltage level of FDV is also applied across the body diode 811 of SWAb. Then when SWAt is switched off and the inductive current forward biases the body diode 811 of SWAb, the forward bias voltage FDV is negative and is much smaller in amplitude. The voltage sampling circuit 210 is configured to process the negative voltage level of FDV at a relatively good resolution to obtain relatively accurate results. The voltage sampling circuit 210 includes a protection and voltage sampler circuit 602. The protection and voltage sampler circuit 602 may include a voltage limiter (not shown) that limits input voltage to a maximum magnitude to protect the remaining sensitive circuitry of the voltage sampling circuit 210 from overvoltage or saturation when the upper power switch SWAt is turned on. In addition, the protection and voltage sampler circuit 602 may also include a voltage shifter (not shown) that shifts the negative input voltage to a positive voltage level relative to ground. Also, the protection and voltage sampler circuit 602 may include a voltage sampler (not shown) that samples the positive voltage and outputs a voltage sample VS. The protection and voltage sampler circuit 602 is shown as a single block but may be configured as separate functional circuits.

The voltage sample VS is provided to an input of an amplifier 604 with gain G that provides an output signal G*VS. G*VS is provided to an input of an analog to digital converter (ADC) 606 that converts the input analog signal G*VS to a digital sample value DS. The gain G of the amplifier 604 is selected to amplify the expected voltage level or voltage range of VS to an optimal voltage range for the ADC 606. Each digital sample DS is provided to the processing circuit 212.

Referring back to FIG. 2, when prompted by the switch monitor 216, or otherwise independently when the electric motor 102 is stopped, the test controller 216 determines the mode of operation or otherwise operates in a selected mode (continuous or discontinuous), controls the power switch driver 204, either directly or via the motor controller 202, to generate test pulses on PWM_At for each of multiple test cycles for each test procedure, controls the voltage sampling circuit 210 to generate multiple samples DS of FDV for each of the multiple test cycles, prompts the processing circuit 212 to convert the DS samples to the voltage value VA and the slope value S as further described herein, and prompts the converter 214 to use VA and S to access and output a corresponding estimated temperature value ET.

Figure 7:
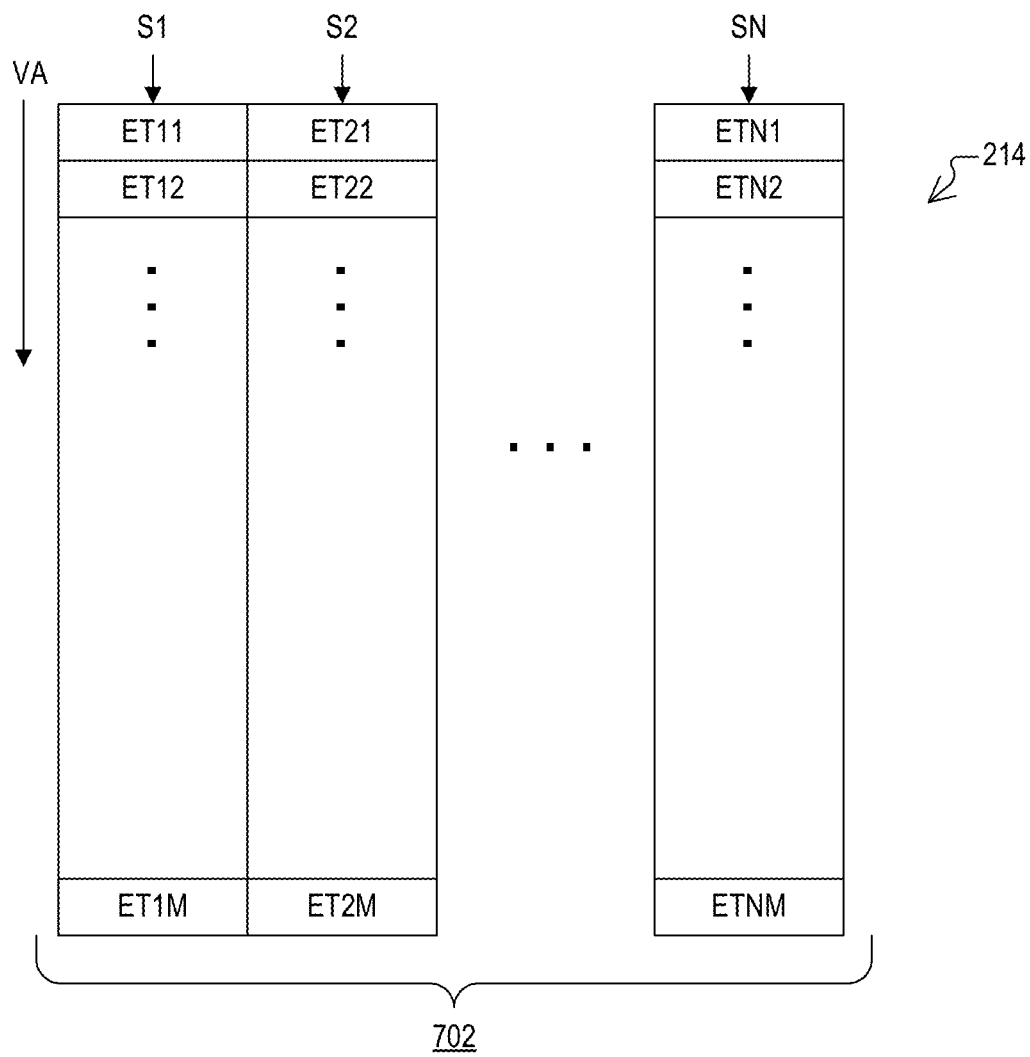
FIG. 7 is a simplified block diagram of the converter of FIG. 2, which is implemented as a lookup table according to one embodiment.

FIG. 7 is a simplified block diagram of the converter 214 implemented as a lookup table 702 according to one embodiment. In particular, the VA and S values may be used as lookup or index values into the table 702 to access the corresponding stored estimated temperature value ET. The estimated temperature values stored in the table 702 are based on characteristic information of the body diode 811 of the power switch SWAb, the load parameters of the electric motor 102, and the duration of the test pulse. In the illustrated embodiment, the table 702 is organized into multiple sections, shown as table columns. Each column is addressed by a corresponding value of the sample value S, or S1, S2, . . . , SN for an integer number N of possible discrete slope values. Each column stores a number M of estimated temperature values associated with one of the slope values, in which M is a total integer number of possible discrete voltage values. The voltage value VA is applied as an index to a corresponding row within the section or column selected by the S value to select a corresponding estimated temperature value. As shown, a first column associated with slope value S1 includes corresponding estimated temperature values ET11, ET12, . . . , ET1M, a second column associated with slope value S2 includes corresponding estimated temperature values ET21, ET22, . . . , ET2M, and so on up to a last or Nth column associated with slope value SN, which includes corresponding estimated temperature values ETN1, ETN2, . . . , ETNM. In this manner, the S value selects a section or column and the VA value selects a row entry in the selected column to access the corresponding estimated temperature value.

The N×M size of the table 702 determines the number of discrete estimated temperature values ETN1-ETNM are stored. The resolution may be increased by increasing one or both of N and M and solving the corresponding ET values. As described further herein, a model is used to represent the characteristics of the electric motor 102 (or load) and the body diode 811 of the power switch SWAb to determine the response to a predetermined or known test pulse applied by the motor control unit 104. In general, the forward voltage of the body diode 811 depends on the body diode forward current and the die temperature. For fixed duty cycle (e.g., test pulse duration) and known load parameters, the need for knowing of the forward current can be overcame by characterization of the body diode for various temperatures. In case the load parameters change with temperature (e.g. resistance), such change can be also characterized using a multipoint characterization which determines the time response of the forward voltage to the applied duty cycle. The characterization data is stored as the estimated temperature values in the table 702, which are accessed with corresponding voltage and slope values.

It is noted that the relative accuracy of the model may be determined based on how the parameters of the power switch SWAb and the electric motor 102 are determined. For systems in which high accuracy is desired, the characterization information may be determined by empirical data during testing of the actual devices (actual power switch (e.g., actual MOSFET) and actual electric motor) used in the system. The characterization information may be determined by empirical data during testing of actual model devices that represent the actual devices used in a system, such as using a MOSFET that is the same type as the MOSFET used as SWAb and an electric motor that is the same type and model as that used in the system. Less accuracy may be achieved by using bulk or data sheet parameters of power switches and electric motors used in the system.

A mathematical model of the system is now described to illustrate how the temperature of the power switch SWAb is estimated based on samples of the forward voltage of the body diode 811. It is noted, however, that the particular model is exemplary only and other methods may be used. A simple series R-L (resistance-inductance) circuit may be used to represent the electric motor 102, while the body diode 811 is represented by the Shockley equation as shown by the following equation (1):

$$I = I_S \cdot e^{\frac{V_D}{n \cdot V_T}} \quad (1)$$

where I is the current through the body diode 811, $I_S$ is the reverse leakage current which is typically about 10 picoamperes (pA), $V_D$ is the voltage over the body diode 811, n is an ideal factor (1.06 is considered as an example), and $V_T$ is the thermal voltage usually expressed according to the following equation (2):

$$V_T = \frac{k \cdot T}{q} \quad (2)$$

in which k is the Boltzmann constant, q is the elementary charge of an electron, and T represents the temperature in degrees Kelvin (° K). The thermal voltage $V_T$ is typically 25.8563 millivolts (mV) at 300° K.

The model is based on a two-state model, in which the first state $I_{state1}$ represents the test pulse applied on PWM_At according to the following equation (3):

$$I_{state1} = \frac{U}{R_{Load} + R_{DSon}} \cdot \left(1 - e^{-t \cdot \frac{R_{Load} + R_{DSon}}{L}}\right) \quad (3)$$

where U is the voltage of the source (e.g., 12 V for an automotive application), $R_{Load}$ is the load resistance of the electric motor 102, $R_{DSon}$ is the on-resistance of the upper power switch SWAt (when configured as a MOSFET), L is the inductance of the electric motor 102, and t is the time relative to an initial condition. To obtain the current at the end of the test pulse, the time t is set to the end of the period.

A similar model may be used for the second state $I_{state2}$, which represents the freewheeling operation beginning at about time t1 according to the following equation (4):

$$I_{state2} = I_{state1(endOfPulse)} \cdot e^{-t \cdot \frac{R_{Load}}{L}} \quad (4)$$

in which the current from the previous state is taken as an initial condition, expressed by $I_{state1(endOfPulse)}$. The $R_{DSon}$ resistance is neglected, since the upper power switch is not involved in the second state since turned off after the test pulse goes back low. To obtain the current at the measuring point, the time is set to this measuring point relative to the beginning of the freewheeling state.

Figure 9:
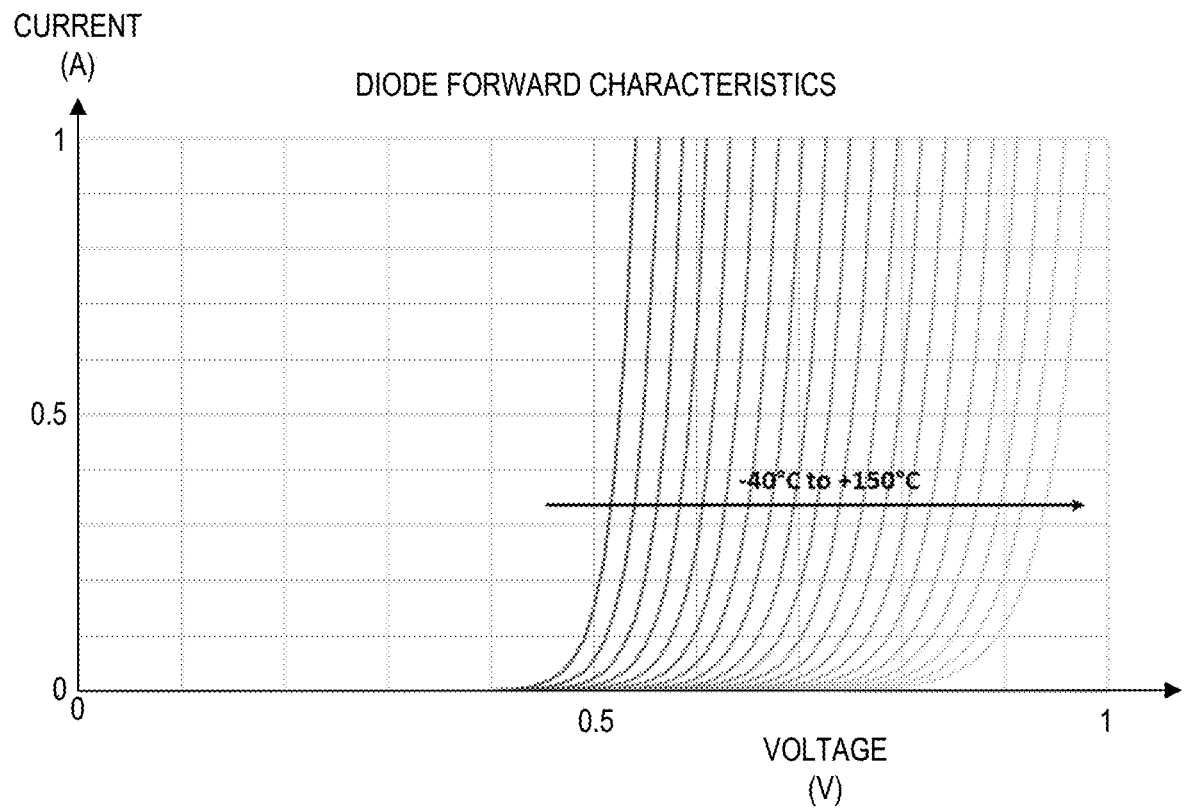
FIG. 9 plots the body diode forward characteristics (current versus voltage) over an extended temperature range for the power switch SWAb when implemented as a MOSFET such as shown in FIG. 8.

Both models can be extended with the resistance change over the temperature according to the following equation (5):

$$R_{Load} = R_{Load(ref)} \cdot (1 + \alpha \cdot (T - T_{ref})) \quad (5)$$

where $R_{Load(ref)}$ is the resistance at the reference temperature $T_{ref}$, α is the thermal coefficient of the material, and T is the actual temperature. The voltage over the body diode 811 can be expressed by solving the Shockley equation. Although this can be done, an inverse piecewise linear interpolation may also be used to simplify the computation as shown in FIG. 9. FIG. 9 plots the body diode forward characteristics (current versus voltage) for discrete temperature values selected over an extended temperature range of −40 degrees Celsius (° C.) to 150° C. for the power switch SWAb when implemented as a MOSFET such as shown in FIG. 8. The voltage over the body diode 810 during the freewheeling portion of each cycle can be evaluated for a combination of body diode temperature and the load temperature (temperature of the electric motor 102). The diode temperature leads to a different characteristic of the Shockley equation, while the load temperature changes the resistance, thus the time constant and the dynamic response of the load to the testing pulse.

Figure 10:
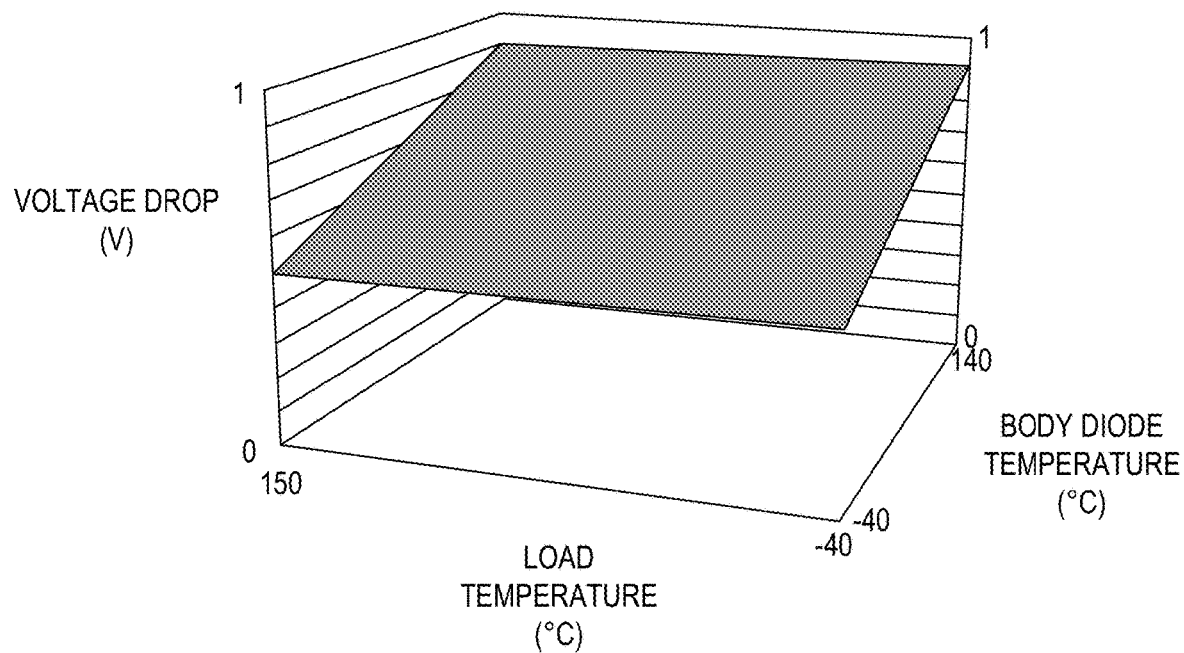
FIGS. 10 and 11 are plots of the resulting charts for R-L time constants variation between 30 to 10 microseconds (μs), testing pulse width of 2 μs and a maximum current of 0.23 Amperes (A) and measuring points at 10 μs and 20 μs after the testing pulse is switched off for the power switch SWAb when implemented as a MOSFET such as shown in FIG. 8.
Figure 11:
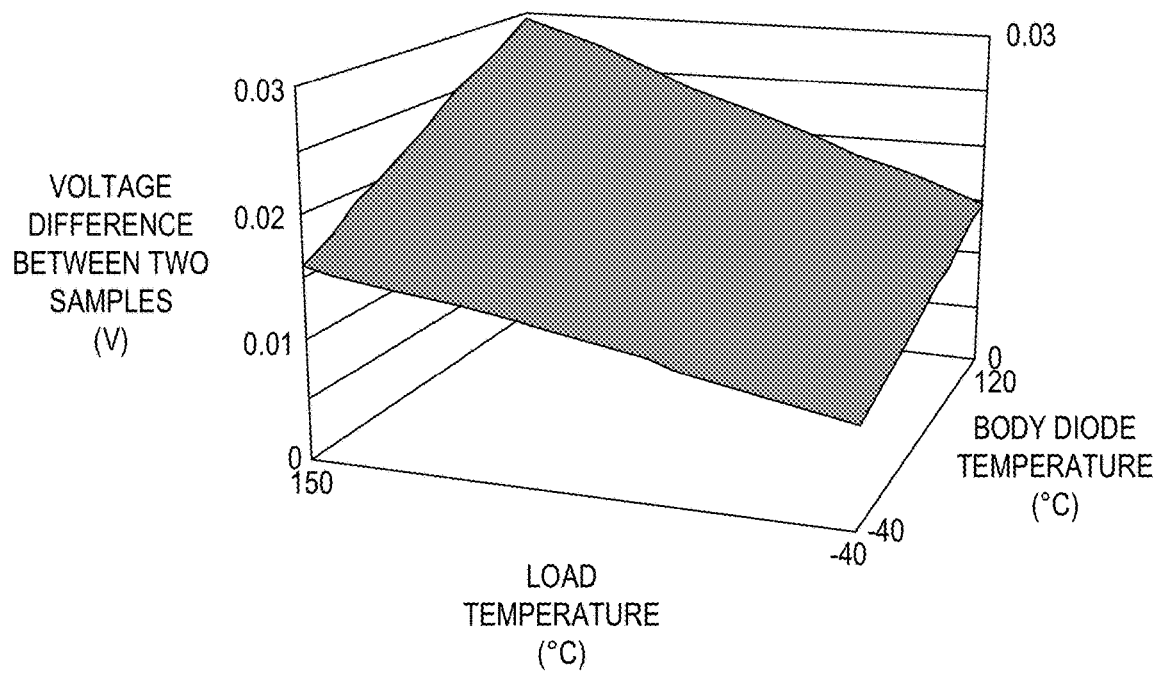

FIGS. 10 and 11 are plots of the resulting charts for R-L time constants variation between 30 to 10 microseconds (μs), testing pulse width of 2 μs and a maximum current of 0.23 Amperes (A) and measuring points at 10 μs and 20 μs after the testing pulse is switched off for the power switch SWAb when implemented as a MOSFET such as shown in FIG. 8. The first chart in FIG. 10 shows the voltage drop at the first measuring point. The second chart of FIG. 11 shows the difference (or slope) between two consecutive measuring points. In conclusion, the voltage drop has a different gradient of the area than the difference area, thus the combination of two values, meaning the voltage drop as represented by the voltage value VA and the slope value are unique and thus can be used to determine the temperature of the power switch (as modeled by a MOSFET).

In general, the body diode forward voltage, or FDV, depends on the body diode forward current, or IT, and the die temperature of the power switch SWAb. For fixed duty cycle and known load parameters, the need for knowing of the forward current IT can be overcame by characterization of the body diode 811 of the power switch SWAb for various temperatures. The table 702, if used, incorporates this information as previously described for selected discrete values of voltage and slope. The voltage FDV is sampled multiple times during the continuous or discontinuous mode while IT is above its minimum value. The voltage samples are then processed to determine the voltage amplitude value VA and the slope value S representing the gradient or rate of change of the voltage. The value VA is more related to the resistance of the entire circuit, whereas the slope value S is related to the time constant of the entire circuit. Based on known characterization of the circuit and the determinations of VA and S, the initial temperature is estimated to provide the ET value.

Many different types of electric noises are present within the sampled signals of actual physical systems, so that filtering or averaging is performed to improve accuracy. As previously described, each test procedure to determine an estimated temperature value includes multiple testing cycles in which corresponding samples are filtered or averaged. In the case of software filtering, every first, every second and every other subsequent sample of each measuring window may be filtered or averaged separately to keep the information about the slope of the signal. The slope and amplitude values are then determined from these filtered or averaged results.

For evaluation of the samples, any one of several different techniques may be used. As an example, three or more sampling points can be evaluated using least square linear regression equations. For example, a linear regression function may be used according to the following equation (6):

$$\text{Voltage} = \text{slope} \cdot \text{time} + \text{offset} \tag{6}$$

in which "Voltage" is the time varying voltage of FDV during the test, slope is the slope value S, and offset may be used as the voltage value VA. The slope may be calculated according to the following equation (7):

$$\text{slope} = \frac{NumOfSamples \cdot \sum_i (\text{time}_i \cdot \text{Voltage}_i) - \sum_i (\text{time}_i) \cdot \sum_i (\text{Voltage}_i)}{NumOfSamples \cdot \sum_i (\text{time}_i^2) - \left(\sum_i (\text{time}_i)\right)^2} \tag{7}$$

in which "i" is an index value, NumOfSamples is the number of samples per test cycle, time, is the time point of each filtered or averaged sample, and Voltage, is the voltage of each filtered or averaged sample. The offset value, which may be used as the voltage value VA, is determined according to the following equation (8):

$$\text{offset} = \frac{\sum_i (\text{Voltage}_i) - \text{slope} \cdot \sum_i (\text{time}_i)}{NumOfSamples} \tag{8}$$

The processing circuit 212 may process the samples DS of FDV by filtering or averaging the samples as previously described and then by applying equations (7) and (8) to the filtered or averaged samples to determine VA and S. Then VA and S are applied to the converter 214 to obtain the ET value (e.g., applied as index values to the table 702 when used to implement the converter 214).

In an alternative embodiment, two sampling points (subsequent, indexed as 1 and 2) can be evaluated using linear interpolation to solve equation (6). The slope value may be determined according to the following equation (9):

$$\text{slope} = \frac{\text{Voltage}_2 - \text{Voltage}_1}{\text{time}_2 - \text{time}_1} \tag{9}$$

and the offset value for providing the VA value may be determined according to the following equation (10):

$$\text{offset} = \text{Voltage}_1 - \text{slope} \cdot \text{time}_1 \tag{10}$$

Again, the processing circuit 212 may process the samples DS of FDV by filtering or averaging each pair of samples over the multiple test cycles as previously described, and then by applying equations (9) and (10) to the filtered or averaged samples to determine VA and S. Then VA and S are applied to the converter 214 to obtain the ET value.

The process may be further simplified for either method may determining the slope according to the following equation (11):

$$\text{delta} = \text{Voltage}_{i+1} - \text{Voltage}_i \tag{11}$$

in which delta is a simple difference between filtered or averaged voltage samples.

Figure 12:
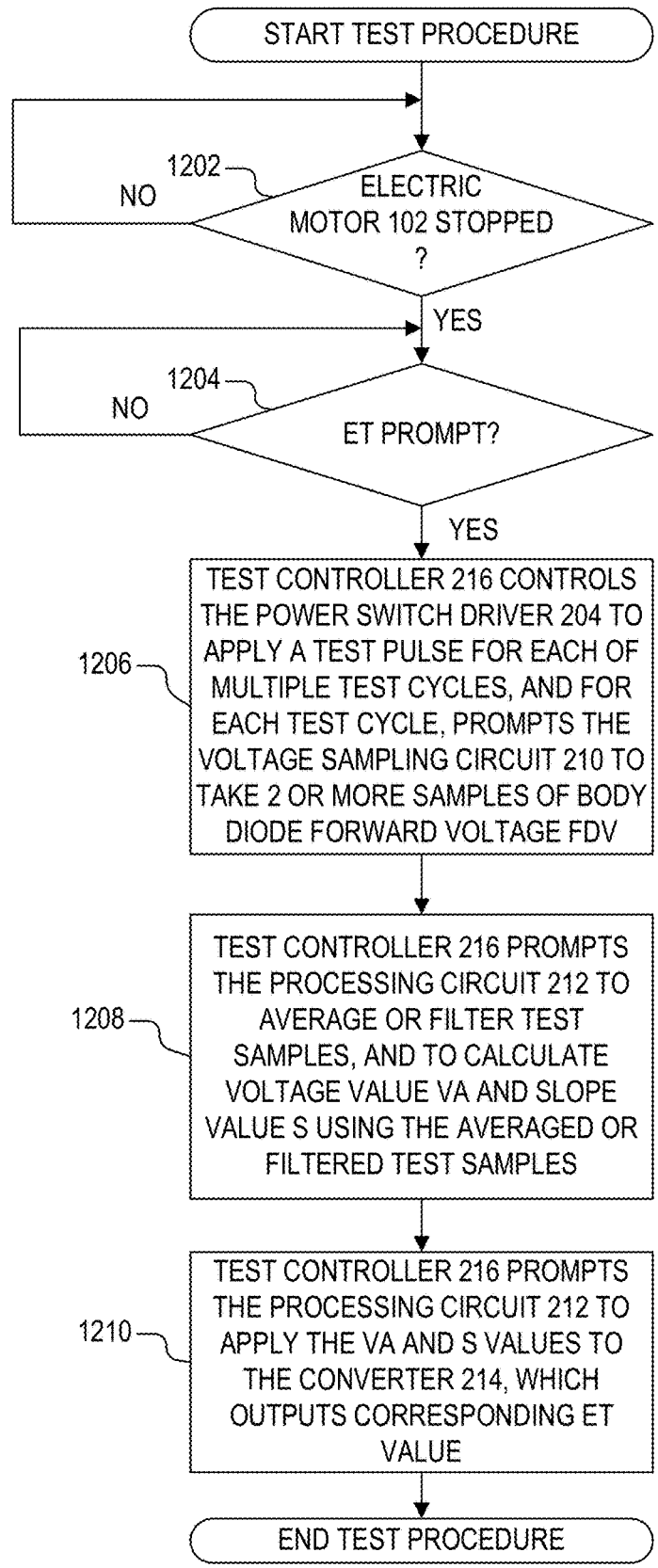
FIG. 12 is a flowchart diagram illustrating a test procedure performed by the temperature estimation system of FIG. 1 according to one embodiment.

FIG. 12 is a flowchart diagram illustrating a test procedure performed by the temperature estimation system 106 according to one embodiment. At first block 1202, it is queried whether the electric motor 102 is stopped, and at next block 1204, it is queried whether the test controller 216 of the temperature estimation system 106 has been prompted to determine and provide an estimated temperature value ET. Blocks 1202 and 1204 may be performed in any order and either block 1202 or 1204 may be omitted depending upon the particular configuration. For example, block 1202 may be omitted if it can be assumed that the power switch monitor 206 prompts the test controller 216 via signal PT for an ET value only when the electric motor 102 is stopped. Alternatively, block 1204 may be omitted if the test controller 216 is configured to independently verify that the electric motor 102 is stopped and to independently perform the test procedure between operating periods with or without being prompted.

After either one or both of blocks 1202 and 1204 are true, operation advances to block 1206 in which the test controller 216 controls the power switch driver 204, either directly or via the motor control unit 104, to apply a test pulse for each of multiple test cycles, and for each test cycle, prompts the voltage sampling circuit 210 to take 2 or more samples of FDV. At next block 1208, the test controller 216 prompts the processing circuit 212 to average or filter the test samples, and to calculate the voltage value VA and the slope value S using the averaged or filtered test samples. The samples may be averaged or filtered dynamically as they are provided for each test cycle. Alternatively, the samples may be averaged or filtered after the test cycles are completed, but such may require the processing circuit 212 to include memory for storage of the samples. At next block 1210, the test controller 216 prompts the processing circuit 212 to apply the calculated VA and S values to the converter 214, which outputs the corresponding ET value. The ET value may be stored or otherwise directly provided to the power switch monitor 206. Once the ET value is provided, operation for the current test procedure is completed. The test procedure is repeated as often as necessary during normal operation between operating sessions while the electric motor 102 is stopped.

A system for estimating temperature of a power transistor of a multiphase power converter coupled to an inductive load according to one embodiment includes a test controller, a voltage sampling circuit, a processing circuit, and a converter. The multiphase power converter includes a drive circuit that controls multiple half bridges. The test controller controls the drive circuit to turn on an upper power switch of a first half bridge and a lower power switch of a second half bridge while the inductive load is not operating, in which the upper power switch is turned on by a test pulse having a pulse width sufficient to generate a test current through the inductive load without driving the inductive load into operation. The test current forward biases a body diode of a lower power switch of the first half bridge when the upper power switch of the first half bridge is turned off after the test pulse is terminated. The voltage sampling circuit takes multiple samples of a voltage across the body diode while forward biased and provides corresponding digital voltage samples. The processing circuit converts the digital voltage samples to a voltage value and a slope value. The converter converts the voltage and slope values to an estimated temperature value based on a characterization of the inductive load and a characterization of the body diode of the lower power switch of the first half bridge.

The width or duration of the test pulse may be less than a minimum duration that drives the inductive load into operation, so that the load is not driven into operation. When the inductive load is an electric motor, for example, the test pulse is applied when the motor is stopped and the test pulse does not cause the motor to move or begin spinning. The voltage sampling circuit may include a protection and voltage sampler circuit, a voltage amplifier, and an analog to digital converter (ADC). The protection and voltage sampler circuit blocks input voltages above a predetermined voltage level and otherwise samples the body diode forward voltage to provide multiple voltage samples. The voltage amplifier and ADC converts the voltage samples to the digital voltage samples.

The processing circuit may process the digital voltage samples according to a linear function to determine the slope value as a rate of change of voltage and to determine the voltage value as a voltage offset. The converter may be implemented as a table that stores multiple estimated temperature values, each corresponding to discrete values of the voltage value and the slope value. In one embodiment, the voltage and slope values are used as index values into the table to select a corresponding and unique estimated temperature value.

The test controller may perform multiple test cycles with multiple test pulses, in which the voltage sampling circuit generates a set of digital voltage samples for each test cycle. The processing circuit may average corresponding digital voltage samples or may otherwise filter the multiple sets of digital voltage samples to determine the voltage and slope information.

The test controller may control the drive circuit in a discontinuous mode or a continuous mode. When using the discontinuous mode, the processing circuit may compare a gradient between successive digital voltage samples to identify and reject any invalid digital test samples. The continuous mode avoids the validity test since each subsequent test cycle is initiated while the test current is still varying in a linear manner.

The power switches implementing the half bridges may be implemented with MOSFETs. The inductive load may be a multiphase electric motor or the like.

A method of estimating temperature of a power transistor of a multiphase power converter including multiple half bridges coupled to an inductive load according to one embodiment includes turning on an upper power switch of a first half bridge while the inductive load is not operating with a test pulse having a pulse width sufficient to generate a test current through the inductive load without driving the inductive load into operation, turning on a lower power switch of a second half bridge during the test pulse and keeping lower power switch of a second half bridge turned on after completion of the test pulse so that the test current flowing through the inductive load forward biases a body diode of a lower power switch of the first half bridge, sampling a voltage across the body diode multiple times while forward biased and providing corresponding digital voltage samples, converting the digital voltage samples to a voltage value and a slope value, and converting the voltage value and the slope value to an estimated temperature value based on a characterization of the inductive load and a characterization of the body diode of the lower power switch of the first half bridge.

The method may include turning on the upper power switch of the first half bridge with the test pulse having a duration that is less than a minimum duration that drives the indicative load into operation. The method may include isolating the voltage across the body diode from an input of a sampler during the test pulse and providing the voltage across the body diode to the input of the sampler after the test pulse, amplifying multiple voltage samples, and converting the amplified voltage samples to the digital voltage samples.

The method may include processing the digital voltage samples according to a linear function to determine the slope value as a rate of change of voltage and to determine the voltage value as a voltage offset of the linear function. The method may include applying the voltage value and the slope value to a table that stores estimated temperature values based on a predetermined characterization of the inductive load and a predetermined characterization of the body diode of the lower power switch of the first half bridge.

The method may include performing multiple test cycles to provide multiple sets of digital voltage samples, and averaging corresponding digital voltage samples of the multiple sets of digital voltage samples., or otherwise filtering the sets of digital voltage samples. The method may include performing multiple test cycles in a continuous or discontinuous mode. For the discontinuous mode, the method may include comparing a gradient between successive digital voltage samples to identify invalid samples.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A system for estimating temperature of a power switch of a multiphase power converter coupled to an inductive load, wherein the multiphase power converter comprises a drive circuit that controls a plurality of half bridges, wherein said temperature estimation system comprises:
   a test controller that controls the drive circuit to turn on an upper power switch of a first half bridge and a lower power switch of a second half bridge while the inductive load is not operating, wherein said upper power switch is turned on by a test pulse having a pulse width to generate a test current through the inductive load while the inductive load is not operating, wherein said test current forward biases a body diode of a lower power switch of said first half bridge when said upper power switch of said first half bridge is turned off after said test pulse is terminated;
   a voltage sampling circuit that takes a plurality of samples of a voltage across said body diode while forward biased and that provides a corresponding plurality of digital voltage samples;
   a processing circuit that converts said plurality of digital voltage samples to a voltage value and a slope value; and
   a converter that converts said voltage value and said slope value to an estimated temperature value based on characteristic information of the inductive load and characteristic information of the body diode of the lower power switch of the first half bridge.

2. The system of claim 1, wherein said pulse width of said test pulse has a duration that is less than a minimum duration that drives the inductive load into operation.

3. The system of claim 1, wherein said voltage sampling circuit comprises:
   a protection and voltage sampler circuit having inputs coupled across current terminals of said lower transistor of said second half bridge and having an output, wherein said protection and voltage sampler circuit blocks input voltages above a predetermined voltage level and samples said voltage across said body diode while forward biased to provide a plurality of voltage samples;
   a voltage amplifier having an input coupled to said output of said protection and voltage sampler circuit and having an output providing a plurality of amplified voltage samples; and
   an analog to digital circuit that converts said plurality of amplified voltage samples to said plurality of digital voltage samples.

4. The temperature estimation system of claim 1, wherein said processing circuit processes said plurality of digital voltage samples according to a linear function to determine said slope value as a rate of change of voltage and to determine said voltage value as a voltage offset.

5. The system of claim 1, wherein said converter comprises a table that stores a plurality of estimated temperature values, wherein said voltage value and said slope value are used to select one of said plurality of estimated temperature values.

6. The system of claim 1, wherein said test controller performs a plurality of test cycles using a plurality of test pulses, wherein said voltage sampling circuit generates a set of said plurality of digital voltage samples for each test cycle, and wherein said processing circuit averages corresponding digital voltage samples of multiple sets of said plurality of digital voltage samples.

7. The system of claim 1, wherein said test controller controls the drive circuit in a discontinuous mode, and wherein said processing circuit compares a gradient between successive ones of said plurality of digital voltage samples to identify and reject any invalid digital test samples.

8. The system of claim 1, wherein said test controller controls the drive circuit in a continuous mode and performs a plurality of test cycles using a plurality of test pulses in which each subsequent test cycle is initiated while said test current is varying in a linear manner.

9. The temperature estimation system of claim 1, wherein said lower power switch of said first half bridge comprises a MOSFET including an inherent body diode.

10. The system of claim 1, wherein the inductive load comprises a multiphase electric motor.

11. A method of estimating temperature of a power transistor of a multiphase power converter including a plurality of half bridges coupled to an inductive load, comprising:
    turning on an upper power switch of a first half bridge while the inductive load is not operating with a test pulse having a pulse width to generate a test current through the inductive load while the inductive load is not operating;
    turning on a lower power switch of a second half bridge during the test pulse and keeping lower power switch of a second half bridge turned on after completion of the test pulse so that the test current flowing through the inductive load forward biases a body diode of a lower power switch of the first half bridge;
    sampling a voltage across the body diode a plurality of times while forward biased and providing a corresponding plurality of digital voltage samples;
    converting the plurality of digital voltage samples to a voltage value and a slope value; and
    converting the voltage value and the slope value to an estimated temperature value based on characteristic information of the inductive load and characteristic information of the body diode of the lower power switch of the first half bridge.

12. The method of claim 11, wherein said turning on an upper power switch of a first half bridge comprises turning on the upper power switch of the first half bridge with the test pulse having a duration that is less than a minimum duration that drives the inductive load into operation.

13. The method of claim 11, wherein said sampling comprises:
    isolating the voltage across the body diode from an input of a sampler during the test pulse and providing the voltage across the body diode to the input of the sampler after the test pulse;
    amplifying a plurality of voltage samples; and
    converting the amplified voltage samples to the plurality of digital voltage samples.

14. The method of claim 11, wherein said converting the plurality of digital voltage samples to a voltage value and a slope value comprises processing the plurality of digital voltage samples according to a linear function to determine the slope value as a rate of change of voltage and to determine the voltage value as a voltage offset of the linear function.

15. The method of claim 11, wherein said converting the voltage value and the slope value to an estimated temperature value comprises applying the voltage value and the slope value to a table that stores a plurality of estimated temperature values based on predetermined characteristic information of the inductive load and predetermined characteristic information of the body diode of the lower power switch of the first half bridge.

16. The method of claim 11, further comprising:
performing a plurality of test cycles by repeating said turning on the upper power switch, said turning on the lower power switch, and said sampling the voltage across the body diode using a plurality of test pulses to provide a plurality of sets of digital voltage samples; and
averaging corresponding digital voltage samples of the plurality of sets of digital voltage samples.

17. The method of claim 11, further comprising:
performing a plurality of test cycles by repeating said turning on the upper power switch, said turning on the lower power switch, and said sampling the voltage across the body diode using a plurality of test pulses to provide a plurality of sets of digital voltage samples; and
filtering the plurality of sets of digital voltage samples.

18. The method of claim 11, further comprising:
performing a plurality of test cycles in a discontinuous mode by repeating said turning on the upper power switch, said turning on the lower power switch, and said sampling the voltage across the body diode using a plurality of test pulses in which the test current reaches a minimum level between consecutive test cycles; and
comparing a gradient between successive ones of the plurality of digital voltage samples to identify invalid samples.

19. The method of claim 11, further comprising performing a plurality of test cycles in a continuous mode by repeating said turning on the upper power switch, said turning on the lower power switch, and said sampling the voltage across the body diode using a plurality of test pulses in which the test current varies linearly between consecutive test cycles.

20. The method of claim 11, wherein said turning on an upper power switch with a test pulse and turning on a lower power switch of a second half bridge during the test pulse and after completion of the test pulse comprises forward biases a body diode of a MOSFET implementing the lower power switch of the first half bridge.

* * * * *